(12) United States Patent
Yoo et al.

(10) Patent No.: US 11,107,705 B2
(45) Date of Patent: Aug. 31, 2021

(54) CLEANING SOLUTION PRODUCTION SYSTEMS AND METHODS, AND PLASMA REACTION TANKS

(71) Applicant: SAMSUNG ELECTRONICS CO., LTD., Suwon-si (KR)

(72) Inventors: Beom Jin Yoo, Hwaseong-si (KR); Min Hyoung Kim, Seoul (KR); Sang Ki Nam, Seongnam-si (KR); Won Hyuk Jang, Seoul (KR); Kyu Hee Han, Seongnam-si (KR); Young Do Kim, Hwaseong-si (KR); Jeong Min Bang, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 155 days.

(21) Appl. No.: 16/505,488

(22) Filed: Jul. 8, 2019

(65) Prior Publication Data

US 2020/0035515 A1 Jan. 30, 2020

(30) Foreign Application Priority Data

Jul. 30, 2018 (KR) .................. 10-2018-0088438

(51) Int. Cl.
*H01L 21/67* (2006.01)
*H01J 37/32* (2006.01)
*H01L 21/02* (2006.01)

(52) U.S. Cl.
CPC .. *H01L 21/67051* (2013.01); *H01J 37/32541* (2013.01); *H01J 37/32559* (2013.01); *H01J 37/32568* (2013.01); *H01L 21/02057* (2013.01); *H01L 21/67017* (2013.01);
(Continued)

(58) Field of Classification Search
CPC ......... H01L 21/67253; H01L 21/67051; H01L 21/67017; H01L 21/02057; H01L 21/02068; H01J 37/32568; H01J 37/32541; H01J 37/32559; H01J 2237/335
See application file for complete search history.

(56) References Cited

U.S. PATENT DOCUMENTS 6,006,763 A * 12/1999 Mori .................. B08B 3/10
134/1.1
6,030,506 A * 2/2000 Bittenson ............. B01D 53/007
204/164

(Continued)

FOREIGN PATENT DOCUMENTS

JP 2008063648 A 3/2008
JP 2013223824 A 10/2013
(Continued)

*Primary Examiner* — Benjamin L Osterhout
(74) *Attorney, Agent, or Firm* — Volentine, Whitt & Francos, PLLC

(57) ABSTRACT

A cleaning solution production system is for cleaning a semiconductor substrate. The system includes a pressure tank, a plasma reaction tank configured to form a plasma in gas bubbles suspended in a decompressed liquid obtained from the pressure tank to thereby generate radical species in the decompressed liquid, a storage tank configured to store a cleaning solution containing the radical species generated in the plasma reaction tank, and a nozzle configured to supply the cleaning solution from the storage tank to a semiconductor substrate.

20 Claims, 13 Drawing Sheets

(52) U.S. Cl.
CPC .. *H01L 21/67253* (2013.01); *H01J 2237/335* (2013.01); *H01L 21/02068* (2013.01)

(56) References Cited

U.S. PATENT DOCUMENTS

| | | | | |
|---|---|---|---|---|
| 7,482,303 | B2* | 1/2009 | Bosteels | F01N 3/2803 |
| | | | | 502/180 |
| 7,704,401 | B2 | 4/2010 | Ike et al. | |
| 8,716,939 | B2 | 5/2014 | Utano et al. | |
| 9,540,256 | B2* | 1/2017 | Fujikane | C02F 1/4608 |
| 9,677,940 | B2 | 6/2017 | Kumagai et al. | |
| 9,845,250 | B2 | 12/2017 | Kang | |
| 2007/0220873 | A1* | 9/2007 | Bosteels | F01N 3/10 |
| | | | | 60/299 |
| 2010/0174776 | A1* | 7/2010 | Westberg | H04L 12/2812 |
| | | | | 709/203 |
| 2014/0138029 | A1* | 5/2014 | Narita | C02F 1/78 |
| | | | | 156/345.27 |
| 2015/0126044 | A1* | 5/2015 | Kato | H01L 21/02274 |
| | | | | 438/790 |
| 2016/0362311 | A1 | 12/2016 | Kimiya et al. | |
| 2017/0327390 | A1 | 11/2017 | Imada et al. | |

FOREIGN PATENT DOCUMENTS

| | | |
|---|---|---|
| JP | 5540351 | 5/2014 |
| JP | 2015093864 A | 5/2015 |
| JP | 2016078010 A | 5/2016 |
| JP | 2016107165 A | 6/2016 |
| JP | 2016162963 A | 9/2016 |
| JP | 2016203082 A | 12/2016 |
| JP | 6252926 | 12/2017 |
| KR | 0740638 | 7/2007 |
| WO | WO2009099138 | 8/2009 |
| WO | WO2018021562 A1 | 2/2018 |

* cited by examiner

CLEANING SOLUTION PRODUCTION SYSTEMS AND METHODS, AND PLASMA REACTION TANKS

A claim of priority is made to Korean Patent Application No. 10-2018-0088438 filed Jul. 30, 2018, in the Korean Intellectual Property Office, the disclosure of which is incorporated herein by reference in its entirety.

BACKGROUND

The present disclosure relates to the production of cleaning solutions, particularly the production of cleaning solutions that may be utilized in the fabrication of semiconductor devices.

In the fabrication of semiconductor devices, cleaning processes are carried out to remove residues produced, for example, during etching processes and the like. Typically, these cleaning processes include exposing a wafer containing the semiconductor devices to a cleaning solution such as cleaning water. Unfortunately, the cleaning solution may unintentionally damage semiconductor patterns of the semiconductor devices, such a metal films formed in active areas of the semiconductor devices. This is because the cleaning solution typically includes sulfuric acid or hydrofluoric acid which can result in corrosion and oxidation of exposed metals of the semiconductor devices. Separately, the acids contained in the cleaning solutions make disposal of used cleaning solutions environmentally costly.

SUMMARY

According to an aspect of the present disclosure, a cleaning solution production system for cleaning a semiconductor substrate is provided. The system includes a pressure tank, a plasma reaction tank configured to form a plasma in gas bubbles suspended in a decompressed liquid obtained from the pressure tank to thereby generate radical species in the decompressed liquid, a storage tank configured to store a cleaning solution containing the radical species generated in the plasma reaction tank, and a nozzle configured to supply the cleaning solution from the storage tank to a semiconductor substrate.

According to another aspect of the present disclosure, a plasma reaction tank is provided. The plasma reaction tank includes a vessel configured to contain a decompressed liquid including gas bubbles suspended in the decompressed liquid, first and second electrodes located at opposite sides of the vessel, the first and second electrodes shielded to prevented any contact with the decompressed liquid, at least one ignition electrode located radially between the first and second electrodes, the at least one ignition electrode shielded to prevent any contact with the decompressed liquid, and a power source configured to drive the first and second electrodes and the at least one ignition electrode to form a plasma in gas bubbles suspended in the decompressed liquid.

According to yet another aspect of the present disclosure, a method of cleaning a semiconductor substrate is provided. The method includes forming plasma in gas bubbles suspended in a liquid, and obtaining a cleaning solution from the liquid having the plasma formed in the gas bubbles, where the cleaning solution includes a concentration of radical species resulting from the plasma in the gas bubbles. The method further includes supplying the cleaning solution to a semiconductor substrate.

BRIEF DESCRIPTION OF THE DRAWINGS

The above and other aspects and features of the present disclosure will become readily apparent from the detailed description that follows, with reference to the accompanying drawings, in which.

DETAILED DESCRIPTION OF EMBODIMENTS

Hereinafter, systems and methods for producing a cleaning solution according to some exemplary embodiments of the present disclosure will be described with reference to the drawings.

Figure 1:
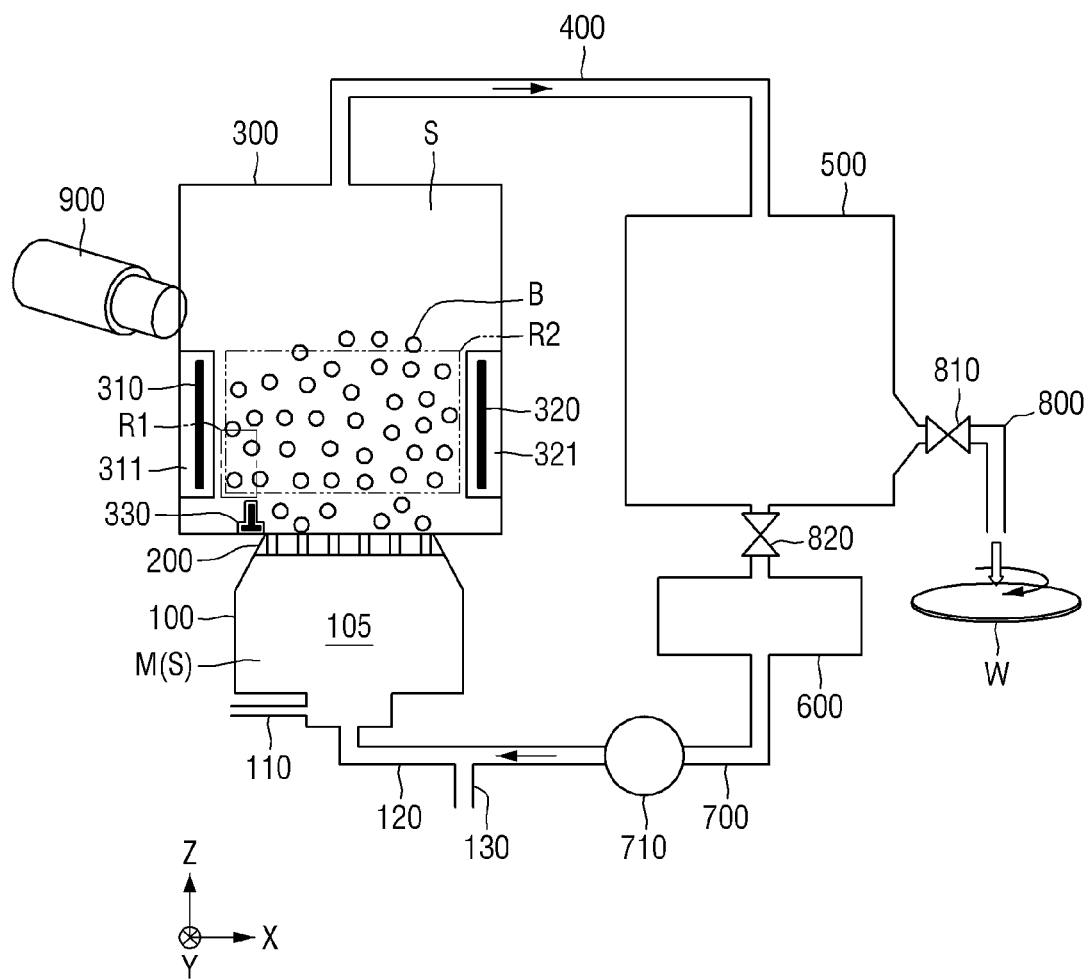
FIG. 1 is a schematic view of a cleaning solution production system according to some exemplary embodiments of the present disclosure.
Figure 2:
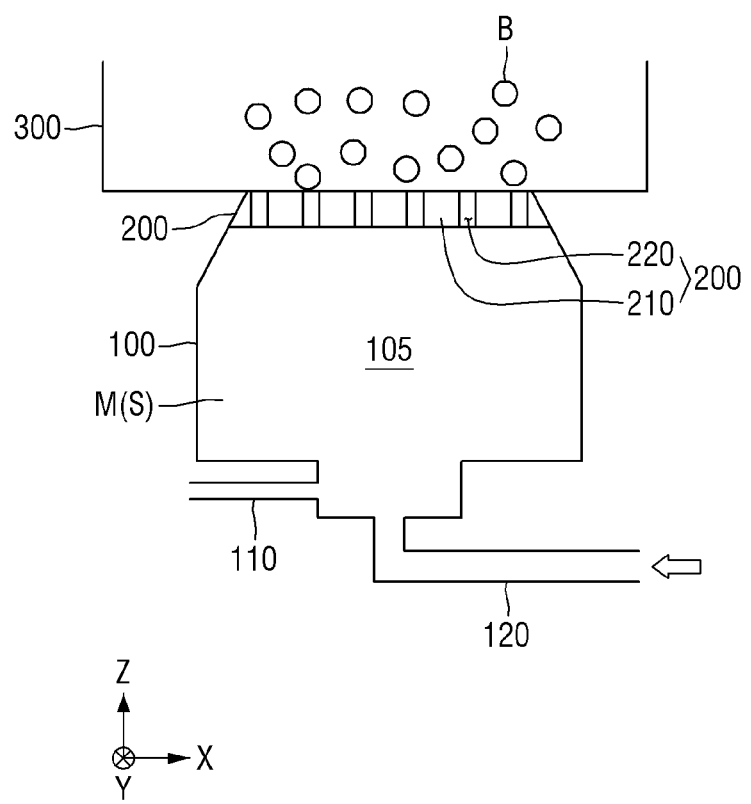
FIG. 2 is a schematic view illustrating examples of a pressurizing portion and a bubble forming portion of the apparatus of FIG. 1.
Figure 3:
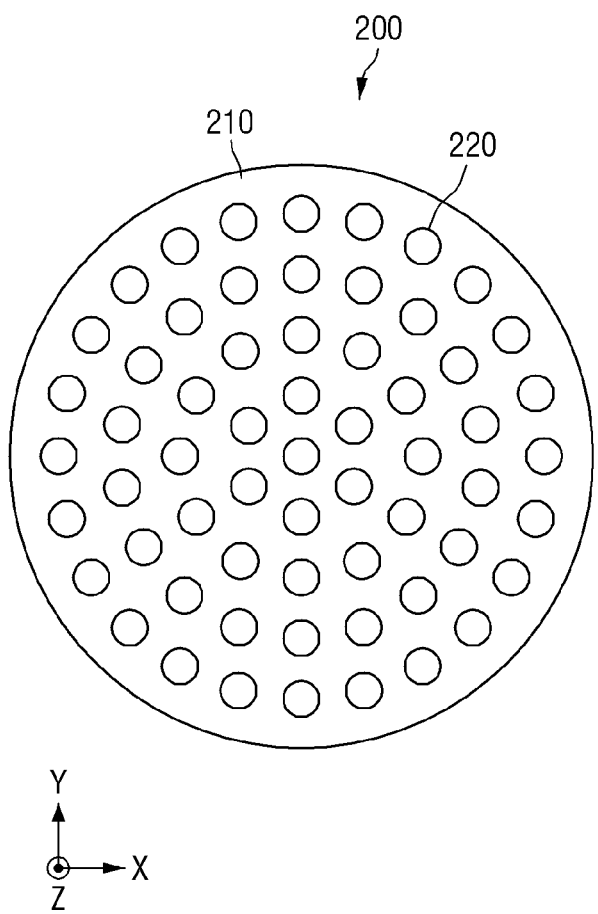
FIG. 3 is a schematic top-view of the bubble forming portion of FIG. 2.

FIG. 1 is a schematic view of a cleaning solution production system according to some exemplary embodiments of the present disclosure, FIG. 2 is a schematic view of an example of a pressurizing portion and a bubble forming portion of the system of FIG. 1, and FIG. 3 is a top view of a bubble formation device of the bubble forming portion of the system of FIG. 1.

Referring to FIG. 1, the cleaning solution production system according to some exemplary embodiments of the present disclosure includes a pressurizing portion 100, a bubble forming portion 200, a plasma reaction tank 300, a first pipe 400, a storage tank 500, a radical sensor 600, a second pipe 700, and a nozzle 800.

For purposes of illustration, in the drawings a first direction X and a second direction Y are horizontal directions which intersect with each other. For example, the first direction X and the second direction Y may be perpendicular to each other. A third direction Z is a vertical direction which intersects with the first direction X and the second direction Y. For example, the third direction Z may be perpendicular to both the first direction X and the second direction Y.

Accordingly, any of the first direction X, the second direction Y, and the third direction Z may be orthogonal to any other of the first direction X, the second direction Y, and the third direction Z.

The pressurizing portion 100 in the example of FIG. 1 includes a pressure tank 105, a gas inlet 110, a liquid forced-transfer portion 120, and a liquid inlet 130. The liquid forced-transfer portion 120 may be a path through which a liquid enters the pressurizing portion 100. In particular, in the example of FIG. 1, the liquid forced-transfer portion 120 is a path through which a cleaning solution S generated in the plasma reaction tank 300 and circulated through the first pipe 400, the storage tank 500, the radical sensor 600, and the second pipe 700 is injected into the pressure tank 105.

Also, the liquid forced-transfer portion 120 may additionally inject a liquid solvent received through the liquid inlet 130 into the pressure tank 105. In the example of FIG. 1, the liquid inlet 130 is located at a side surface of the second pipe 700 connected to the liquid forced-transfer portion 120. However, the location of the liquid inlet 130 is not limited. The liquid solvent may, for example, be at least one of distilled water, carbonated water, electrolyte-ionized water, and cleaning water. However, the embodiments are not limited to these examples.

The gas inlet 110 of the example of this embodiment is a path through which a gas is injected into the pressure tank of the pressurizing portion 100. The gas is for generating radicals in the cleaning solution S, and the type of gas is dependent upon the type of radicals to be used. Examples of the gas injected through the gas inlet 110 include $O_2$, $H_2$, $N_2$, $NF_3$, CxFy, $F_2$, $Cl_2$, $Br_2$, He, Ar, and mixtures of two or more thereof. However, the type of the gas is not limited thereto.

A gas for generating radicals in the cleaning solution S may be inserted through the gas inlet 110. Depending on the type of radicals that are used, the type of the gas injected into the gas inlet 110 may differ. The type of the gas which is injected may include, for example, at least one of $O_2$, $H_2$, $N_2$, $NF_3$, CxFy, $F_2$, $Cl_2$, $Br_2$, He, Ar, and a mixture thereof (where x and y are positive integers). However, the embodiments are not limited to these examples.

In one example, when oxygen $O_2$ is injected via the gas inlet 110, the oxygen is coupled to a liquid such that radicals of at least one of OH, O, $O_2$, $O_3$, $HO_2$, $H_3O$, and H may be contained in the cleaning solution S. On the other hand, when other gases are used, radicals of at least one of NO, $NO_2$, $NO_3$, $CO_2$, $CO_3$, Cl, F, Br, BrO, Cl, ClO, and $HF_2$ may be contained in the cleaning solution S.

Generally, a radical is formed when a reaction occurs due to stimuli such as light, heat, or electricity, and refers to an atom that has an unpaired odd electron or a substance having high reactivity when being formed as a compound. As such, radicals do not remain stable and may exist for a relatively short lifetime and then disappear. Due to the substantially high reactivity thereof, radicals may result in decomposition reactions of organic and inorganic materials which are to be objects of cleaning.

The cleaning solution S of the cleaning solution production system according to some exemplary embodiments of the present disclosure may perform cleaning by decomposing a polymer compound using such radicals. This may prevent a metal pattern from being eroded and oxidized, in comparison to an existing cleaning method using sulfuric acid or fluoric acid. Also, since radicals revert to a harmless liquid or gas such as water, oxygen, or the like upon the lapse of a relatively short lifetime, there is minimal environmental impact.

The gas inlet 110 is connected to the liquid forced-transfer portion 120 in which the liquid inlet 130 is formed such that a solvent and a gas may be mixed with each other. For example, the gas inlet 110 may be connected to a middle portion of the liquid forced-transfer portion 120 such that a gas and a solvent may be mixed with each other according to a flow of the solvent.

The pressurizing portion 100 includes the pressure tank 105 to accommodate a mixture M in which a gas and a liquid are mixed. The mixture M may be formed by mixing the gas and the liquid according to injection rates thereof.

A pressurizing pump (not shown) may be present in the pressurizing portion 100. The pressurizing pump operates to increase pressure in the pressurizing tank 105. When the pressure is increased by the pressurizing pump, a concentration of the gas in the mixture M may increase beyond saturation. In this way, the mixture M may become a compressed liquid of, for example, supersaturated gas-dissolved water in which the gas to be supersaturated is dissolved.

When the mixture M becomes the cleaning solution S and is circulated in the plasma reaction tank 300 and returns to the pressurizing portion 100, the cleaning solution S, rather than the mixture M, may be accommodated in the pressure tank 105 of the pressurizing portion 100.

The bubble forming portion 200 may be operatively connected to the pressurizing portion 100 in order to create bubbles in the compressed liquid received from the pressure tank 105. Referring to FIG. 3, in the example of this embodiment, the bubble forming portion 200 is constituted by a partition plate 210 having orifices 220 formed there through. Referring to FIG. 2, the partition plate 210 is operatively interposed between the pressure tank 105 and the plasma reaction tank 300, with the orifices 220 providing fluid communication from the pressure tank 105 to the plasma reaction tank 300. It is noted that the relative width of the orifices 220 is not necessarily drawn to scale in the drawings. Generally, the width of the orifices 220 is very small so as to form bubbles in the liquid introduced into the plasma reaction tank 300 from the pressure tank 105.

Optionally, the orifices 220 may be closed until the mixture M is supersaturated, and then may be opened. A resultant pressure differential causes the compressed mixture M to rapidly move from the pressure tank 100 to the plasma reaction tank 300 through the orifices 220 of the partition plate 210, and accordingly, bubbles B are formed in a decompressed liquid mixture M contained in the plasma reaction tank 300. Here, the phrase "decompressed liquid" means the liquid mixture M that was compressed in the pressure tank and then decompressed upon introduction into the plasma reaction tank 300. The bubbles B may be bubbles of the gas injected through the gas inlet 110. That is, the gas injected through the gas inlet 110 may be present in the bubbles B.

Although an outer periphery of the partition plate 210 of the bubble forming portion 200 is shown as being of a circular shape in FIG. 3, the embodiments are not limited thereto. That is, the outer circumferential surface of the partition plate 210 of the bubble forming portion 200 may have a quadrangular shape, an oval shape, or any other suitable shape.

Referring again to FIG. 1, the plasma reaction tank 300 includes first and second electrodes 310 and 320 respectively shielded by first and second covers 311 and 321, as well as an ignition electrode 330. These electrodes constitute an electrode configuration which will be described in greater detail below with reference to FIGS. 4-6.

Figure 4:
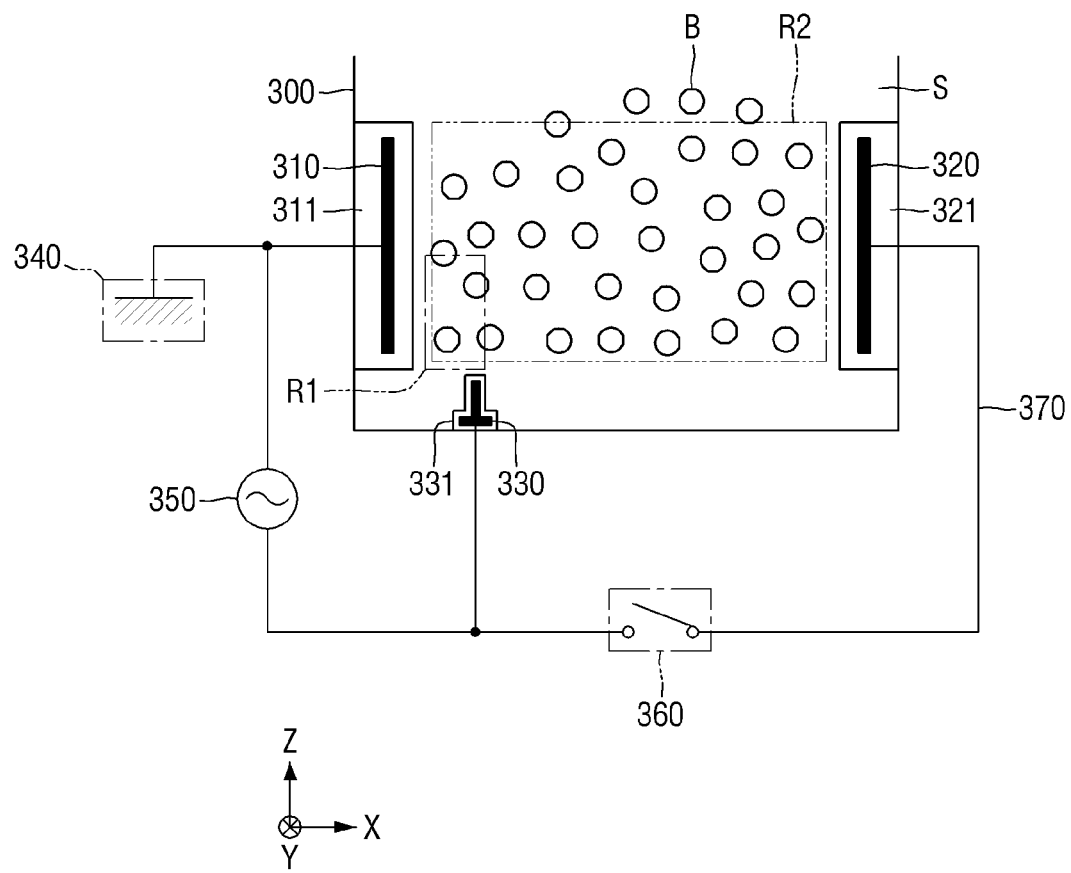
FIG. 4 is a schematic view illustrating an example of an electrode configuration of a plasma reaction tank of FIG. 1.
Figure 5:
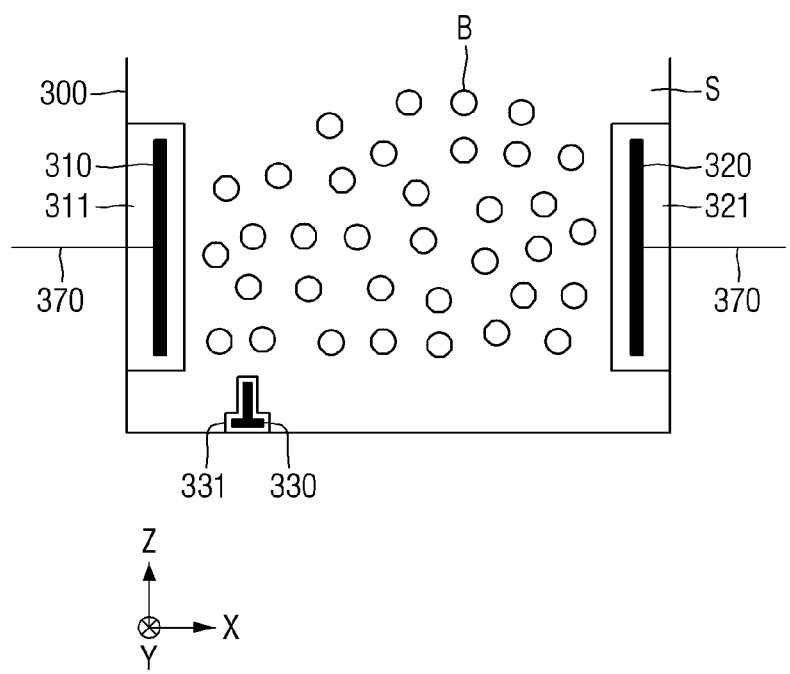
FIG. 5 is a schematic view for reference in describing a first electrode, a second electrode, and an ignition electrode of FIG. 4.
Figure 6:
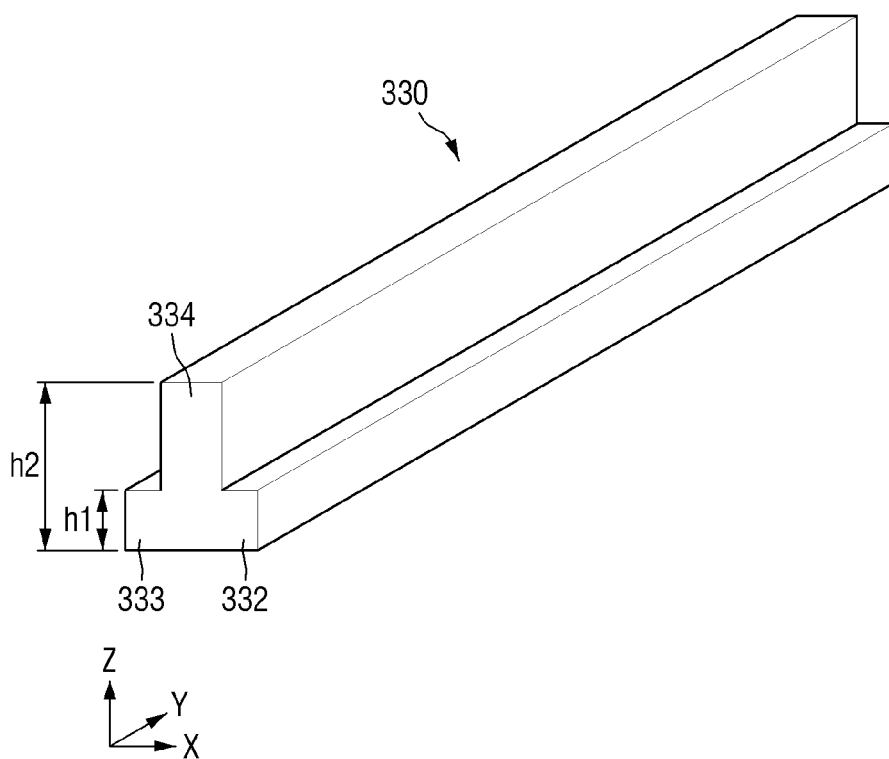
FIG. 6 is a perspective view illustrating an example of the shape of the ignition electrode of FIG. 5.

FIG. 4 is a schematic view illustrating an example of an electrode configuration of the plasma reaction tank of FIG. 1, and FIG. 5 is a schematic view for reference in describing a first electrode, a second electrode, and an ignition electrode of FIG. 4. FIG. 6 is a perspective view illustrating an example of the shape of the ignition electrode of FIG. 5.

Referring to FIGS. 1 and 4 to 6, the plasma reaction tank 300 receives liquid (mixture M) from the pressure tank 105 through the bubble forming portion 200. As explained above, the liquid in the pressure tank 105 is decompressed relative to that in the pressure tank 105, and includes bubbles that are formed as the liquid is passed through the bubble forming portion 200. As a result, gas bubbles are suspended in the decompressed liquid of the pressure tank 105.

In the present embodiment, the mixture M in the plasma reaction tank 300 is converted to a cleaning solution S by formation of plasma within the gas bubbles suspended in the mixture M. The formation of plasma is accomplished by application of voltages to the electrodes 310, 320 and 330.

As shown in the drawings, the first electrode 310 may be formed on one side surface of the plasma reaction tank 300. The first electrode 310 may be embedded in an outer wall of the plasma reaction tank 300. Otherwise, the first electrode 310 may be covered by a first coating 311 in the plasma reaction tank 300. The first coating 311 may act as a shield to block and prevent the cleaning solution S or the mixture M from coming into direct contact with the first electrode 310.

The first electrode 310 may include an electrical conductor. For example, the first electrode 310 may be formed of a metal. On the other hand, the first coating 311 may include an insulator. For example, the first coating 311 may be formed of a non-metallic ceramic material.

The second electrode 320 may be formed on a side surface of the plasma reaction tank 300 opposite that of the first electrode 310. In the example of the drawings, the second electrode 320 is located on the other side spaced apart from the first electrode 310 in the first direction X in the plasma reaction tank 300. With this configuration, the first electrode 310 and the second electrode 320 may apply an electric field to the mixture M located between the first electrode 310 and the second electrode 320.

The second electrode 320 may also be embedded in an outer wall of the plasma reaction tank 300. Otherwise, the second electrode 320 may be covered by a second coating 321 in the plasma reaction tank 300. The second coating 321 may act as a shield to block and prevent the cleaning solution S or the mixture M from coming into direct contact with the second electrode 320.

The second electrode 320 may include an electrical conductor. For example, the second electrode 320 may be formed of a metal. On the other hand, the second coating 321 may include an insulator. For example, the second coating 321 may be formed of a non-metallic ceramic material.

As shown in FIG. 4, the first electrode 310 may be electrically connected to a ground terminal 340 by a wiring 370. The second electrode 320 may be electrically connected to a power source 350 by the wiring 370. The power source 350 may be electrically connected between the second electrode 320 and the ground terminal 340.

A switch 360 may be located on the wiring 370 between the second electrode 320 and the power source 350. A switching operation of the switch 360 may control a connection between the second electrode 320 and the power source 350. That is, when the switch 360 is closed, the second electrode 320 is connected to the power source 350. When the switch 360 is opened, the second electrode 320 is not connected to the power source 350.

The power source 350 may be a direct current (DC) power source or may be an alternating current (AC) power source. The power source 350 may be, for example, a radio frequency (RF) pulse power source, but the embodiments are not limited in this fashion.

The ignition electrode 330 may be located radially between the first electrode 310 and the second electrode 320. That is, as shown in the drawings, the ignition electrode 330 may be disposed relative to the first direction X between the first electrode 310 and the second electrode 320 in the first direction X.

In the example of the present embodiments, the ignition electrode 330 is disposed below or at a bottom region the plasma reaction tank 300. Also in the example of the present embodiments, the ignition electrode 330 does not overlap an area defined between the first electrode 310 and the second electrode 320. That is, the ignition electrode 330 is located relative to the Z direction below the region defined between the first electrode 320 and the second electrode 320.

The ignition electrode 330 may be connected to the power source 350 by the wiring 370. The ignition electrode 330 may be covered by a third coating 331. The third coating 331 may act as a shield to block and prevent the cleaning solution S or the mixture M from coming into direct contact with the ignition electrode 330.

The ignition electrode 330 may include a conductive material. For example, the ignition electrode 330 may be formed of a metal. On the other hand, the third coating 331 may include an insulator. For example, the third coating 331 may be formed of a non-metallic ceramic material.

As described next, plasma is formed in the plasma reaction tank in stages by powering the first, second and ignition electrodes 310, 320 and 330.

In a first plasma formation stage, the switch 360 is open such that the power source 350 is initially applied to the ignition electrode 330. Through this, the ignition electrode 330 may ignite plasma so as to form ignition plasma in a first region R1.

Subsequently, in a second plasma formation stage, the switch 360 is closed so as to apply the power source 350 to the second electrode 320. Through this, active plasma may be formed in a second region R2 by using the applied power to the first and second electrodes 310 and 320.

Igniting the plasma in the first region R1 in the first plasma formation stage facilitates formation of the active plasma by the first and second electrodes 310 and 320 in the second plasma formation phase. In particular, a much higher ignition energy would be needed to ignite the active plasma in the second region R2 using the first and second electrodes 310 and 320 only, i.e., without first igniting plasma in the first region R1 using the ignition electrode 330. The higher ignition energy that would be needed runs the danger of damaging the plasma reaction tank 300. Application of lower energy is made possible by initially igniting plasma using the ignition electrode 330 as described above.

Referring to FIG. 6, the ignition electrode 330 may include a first base portion 332, a second base portion 333, and a protruding portion 334. The first base portion 332 may have a first height h1. The first base portion 332 may extend to the same height in a second direction Y.

The second base portion 333 may have the first height H1 like the first base portion 332. The second base portion 333 may extend to the same height in the second direction Y.

The protruding portion 334 may be located between the first base portion 332 and the second base portion 333 in the first direction X. The protruding portion 334 may have a second height h2. The second height h2 may be higher than the first height h1. The protruding portion 334 may extend to the same height in the second direction Y.

Accordingly, the ignition electrode 330 may be a bar electrode which has an upside-down T-shaped cross section and extends lengthwise in the second direction Y. However, the embodiments are not limited in this fashion.

The plasma reaction tank 300 may apply a voltage to the mixture M using the above-described method. Accordingly, a gas in the bubbles B of the mixture M may be converted into plasma. Such plasma may be defined as bubble liquid plasma. The plasma reaction tank 300 may convert the mixture M into the cleaning solution S including the bubble liquid plasma.

The cleaning solution S may include radicals which are dissolved in the bubble liquid plasma. The radicals may be dissolved in the cleaning solution S in the bubble liquid plasma while the cleaning solution S circulates through the plasma reaction tank 300, the first pipe 400, the storage tank 500, the radical sensor 600, the second pipe 700, the pressurizing portion 100, and the bubble forming portion 200.

Although the radicals may dissipate during circulation due to a short lifetime thereof, the plasma reaction tank 300 may regenerate radicals by applying a voltage. Accordingly, the cleaning solution S may continuously include radicals regardless of dissipation of radicals during circulation.

Referring back to FIG. 1, a plasma monitoring device 900 may be provided in order to check for a type and a concentration of radicals of the cleaning solution S in the plasma reaction tank 300. The plasma monitoring device 900 may also check a type of gas of the bubbles B in the cleaning solution S.

The plasma monitoring device 900 according to some exemplary embodiments of the present disclosure may monitor whether a plasma reaction for generating radicals is performing properly by checking the type and the concentration of each of the gas and the radicals in the plasma reaction tank 300.

When an intended type of radicals is not generated or an intended concentration of radicals is not formed, a plasma reaction may be adjusted by adjusting a flow rate or type of an injected gas.

The plasma monitoring device 900 according to some exemplary embodiments of the present disclosure measures a type and a concentration of radicals by using an electrical measuring method. The electrical measuring method monitors the type and concentration of radicals by analyzing electrical properties of liquid plasma including a dielectric. That is, the electrical measuring method may electrically analyze densities and properties of the bubbles B and plasma. For this, the plasma monitoring device 900 may include a power source and an electrode (not shown). Through this, a voltage or a current may be applied to the cleaning solution S and electrical characteristics such as resistance may be detected so as to measure the type and the concentration of the radicals.

In another example, the plasma monitoring device 900 according to some exemplary embodiments of the present disclosure measures a type and a concentration of radicals by using a microwave analysis method. The microwave analysis method may analyze a density of in-liquid plasma by utilizing wave dispersion relation of microwaves.

In another yet example, the plasma monitoring device 900 according to some exemplary embodiments of the present disclosure may measure a type and a concentration of radicals by using an optical analysis method as described next.

Figure 7:
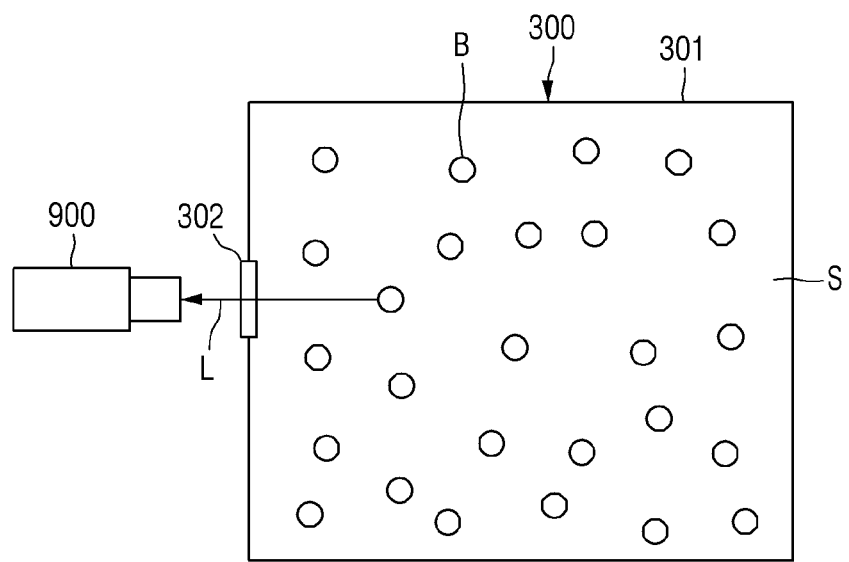
FIG. 7 is a schematic view of an example of a plasma monitoring device of FIG. 1.

FIG. 7 is a schematic view for describing an example of the plasma monitoring device of FIG. 1.

Referring to FIGS. 1 and 7, the plasma monitoring device 900 may be located outside the plasma reaction tank 300.

The plasma reaction tank 300 may include a tank body 301 and a window 302. The tank body 301 is a housing of the plasma reaction tank 300 and may refer to an outer wall part which accommodates the cleaning solution S.

The window 302 may be formed in the tank body 301. The window 302 may be formed of a transparent material to allow an inside of the plasma reaction tank 300 to be monitored from the outside. Due to plasma therein, the bubbles B in the plasma reaction tank 300 may autonomously emit light. Light L generated by the bubbles B may be sensed by the plasma monitoring device 900 through the window 302.

The plasma monitoring device 900 may sense the light L and analyze a type of a plasma gas, a temperature of a gas, and a relative density of plasma so as to measure a type and a concentration of radicals of the cleaning solution S.

In the example of this embodiment, the plasma monitoring device 900 is a measuring module using optical emission spectroscopy (OES).

Since the plasma monitoring device 900 monitors a radical generation reaction of the plasma reaction tank 300, it is possible to check in real time whether generation of the cleaning solution S is being properly performed.

Referring back to FIG. 1, the first pipe 400 may be connected to the plasma reaction tank 300. The first pipe 400 may connect the plasma reaction tank 300 to the storage tank 500. The first pipe 400 may transfer the cleaning solution S in the plasma reaction tank 300 to the storage tank 500.

Although the first pipe 400 is shown as being connected in the third direction Z of the plasma reaction tank 300 in FIG. 1, this is merely an example and the embodiment is not limited thereto.

The storage tank 500 may be connected to the first pipe 400. The storage tank 500 may be a space in which the cleaning solution S containing the radical species generated in the plasma reaction tank 300 is stored. The storage tank 500 may be connected to the first pipe 400, the radical sensor 600, and a nozzle 800.

The storage tank 500 may include a first valve 810 and a second valve 820. The first valve 810 may be located in a part connecting the storage tank 500 to the nozzle 800. The first valve 810 may be closed and then opened responsive to the radical sensor 600 so as to move the cleaning solution S to the nozzle 800.

The second valve 820 may be located in a part connecting the storage tank 500 to the radical sensor 600. The second valve 820 may be opened and then be closed by the radical sensor 600 so as to prevent the cleaning solution S from passing there through.

The operations of the first valve 810 and the second valve 820 will be described below in more detail.

The radical sensor 600 may sense a concentration of radicals of the cleaning solution S of the storage tank 500 using any of a variety of methods.

For example, the radical sensor 600 may sense the concentration of radicals of the cleaning solution S by using a spectroscopic method. The spectroscopic method may be a method of measuring a generation speed and a dissipation speed of a radical reaction product, a consumption factor, or a probe compound by using non-dispersive infrared (NDIR)

or infrared (IR) spectroscopy. Through this, the radical sensor 600 may quantitatively analyze radicals of the cleaning solution S.

As another example, the radical sensor 600 of the cleaning solution production system according to some exemplary embodiments of the present disclosure may measure the concentration of radicals by using electron paramagnetic resonance (EPR). EPR may measure a type and a concentration of radicals by using a magnetic moment measuring method using holes of radicals or spins of electrons. Through this, the radical sensor 600 may quantitatively and qualitatively analyze radicals of the cleaning solution S.

The radical sensor 600 may direct the cleaning solution S to the nozzle when a concentration of particular radicals in the cleaning solution S reaches a reference concentration. For this, the radical sensor 600 may use the first valve 810 and the second valve 820.

In detail, when it is determined that the concentration of particular radicals in the cleaning solution S reaches the reference concentration, the radical sensor 600 may open the first valve 810 and close the second valve 820. Through this, the cleaning solution S located in the storage tank 500 may directed to the nozzle 800. As such, the cleaning solution S which circulates from the storage tank 500 to the radical sensor 600 may not further circulate.

Operations as described above of the first valve 810 and the second valve 820 of the cleaning solution production system according to some exemplary embodiments of the present disclosure are merely an example. The cleaning solution S may be supplied to the nozzle 800 using any method. For example, the second valve 820 may be omitted and the radical sensor 600 may control only the first valve 810 to supply the cleaning solution S to the nozzle 800.

Although the radical sensor 600 is shown as being located in an outlet end of the storage tank 500, the embodiments are not limited thereto. The radical sensor 600 may instead be located at an inlet end of the storage tank 500, or elsewhere other than the outlet or inlet ends of the storage tank 500. Also, a position of the second valve 820 is not particularly limited.

The second pipe 700 may extend from the radical sensor 600. The second pipe 700 may connect the pressurizing portion 100 to the radical sensor 600. The second pipe 700 may be connected to the liquid forced-transfer portion 120 of the pressurizing portion 100. Through this, the cleaning solution S may circulate in an order of the pressurizing portion 100, the bubble forming portion 200, the plasma reaction tank 300, the first pipe 400, the storage tank 500, the radical sensor 600, and the second pipe 700. The circulation may be continued until being stopped by the radical sensor 600.

Although the second pipe 700 is shown as extending from a bottom of the radical sensor 600, that is, a part thereof in the third direction Z, this is merely an example and the second pipe 700 is not limited thereto.

The second pipe 700 may include a circulation pump 710 and the liquid inlet 130.

The circulation pump 710 may allow the cleaning solution S to circulate in the order of the pressurizing portion 100, the bubble forming portion 200, the plasma reaction tank 300, the first pipe 400, the storage tank 500, the radical sensor 600, and the second pipe 700.

A movement direction and velocity of the cleaning solution S may be defined by the circulation pump 710. Although the circulation pump 710 is shown as being located in the second pipe 700 in FIG. 1, the embodiment is not limited thereteo.

The circulation pump 710 may be attached to any position in which the cleaning solution S is present, for example, the first pipe 400 or the storage tank 500.

The liquid inlet 130 may be formed on the side surface of the second pipe 700. A liquid solvent of the cleaning solution S may be inserted through the liquid inlet 130. The liquid inlet 130 is not opened always such that the liquid is injected thereinto. When the cleaning solution S is completely generated, the liquid inlet 130 may be closed to circulate the cleaning solution S.

Although the liquid inlet 130 is shown as being formed in the second pipe 700 in FIG. 1, the liquid inlet 130 may be formed in another part. For example, the liquid inlet 130 may be formed in the pressurizing portion 100.

The nozzle 800 may be connected from the storage tank 500. The nozzle 800 may eject the cleaning solution S including radicals onto a wafer W. Herein, the term nozzle is broadly defined to include any device capable of controlling the direction and/or flow rate of the cleaning solution S onto the wafer W.

The nozzle 800 may employ a central ejection method. In detail, the nozzle 800 may jet the cleaning solution S to a central part of a top surface of the wafer W mounted on a chuck. The jetted cleaning solution S may be developed from the central part to an edge part of the wafer W as the wafer W is rotated.

The nozzle 800 may be present in another position instead of the top of the wafer W in another process and may move to the central part of the wafer W to jet the cleaning solution S as needed.

The cleaning solution production system according to the embodiments generates a cleaning solution by using radicals having a short lifetime. Accordingly, the cleaning solution S is continuously generated in the plasma reaction tank 300 to prevent radicals from dissipating and is circulated such that the cleaning solution S including radicals may be stored in the storage tank 500.

The cleaning solution production system according to the embodiment may use the cleaning solution S using radicals without a hydrofluoric acid component or a sulfuric acid component unlike existing cleaning water. Accordingly, it is possible to prevent corrosion or oxidization, which would otherwise be caused by the cleaning solution, of metal patterns on the wafer W to be protected. Through this, performance and reliability of a semiconductor device on the wafer W may be increased.

Also, since radicals are converted into a harmless material after a short lifetime, the cleaning solution S of the present embodiment is eco-friendly. Also, production costs of the cleaning solution S may be reduced since the use of chemical solvents may be avoided.

Hereinafter, a cleaning solution production system according to some exemplary embodiments of the present disclosure will be described with reference to FIGS. 8 and 9. A description which overlaps with the above-described embodiments will be brief or omitted.

Figure 8:
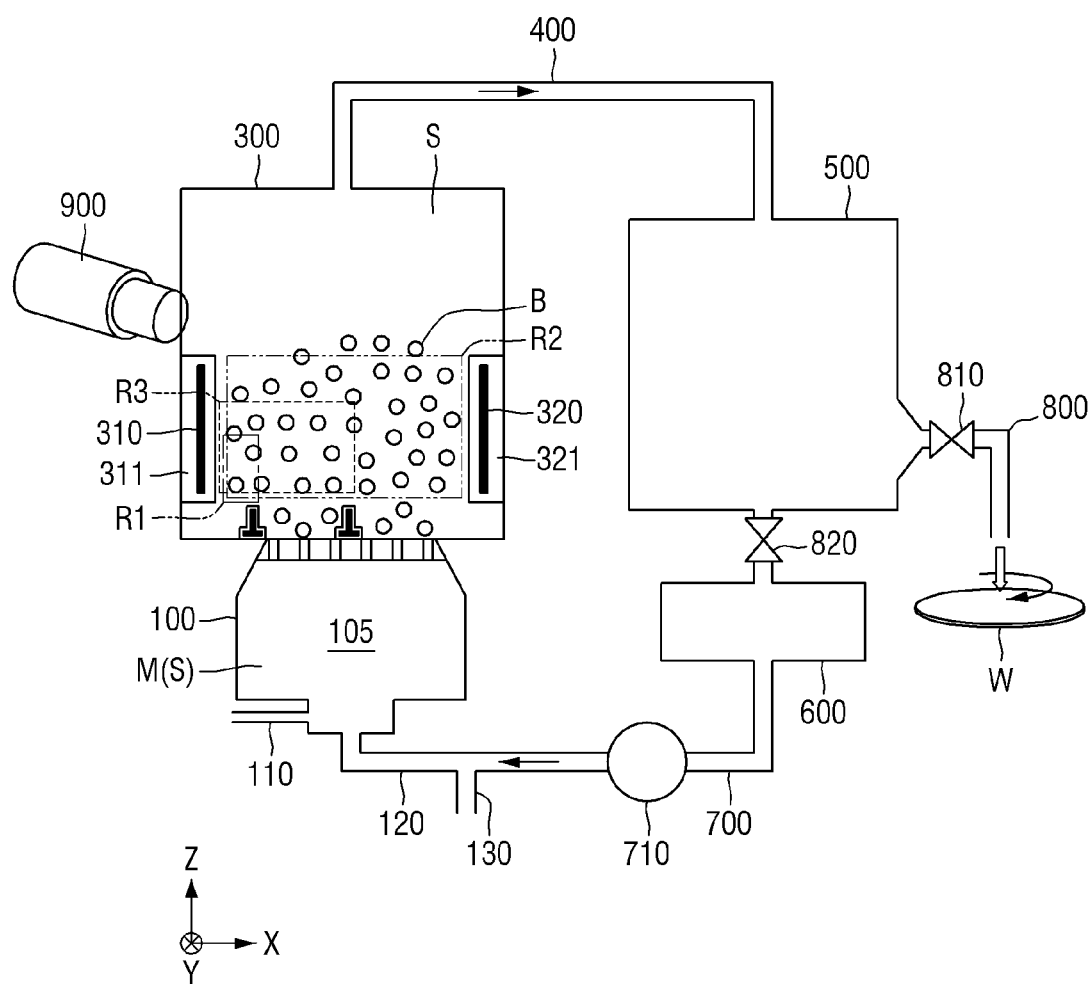
FIG. 8 is a schematic view of a cleaning solution production system according to some exemplary embodiments of the present disclosure.
Figure 9:
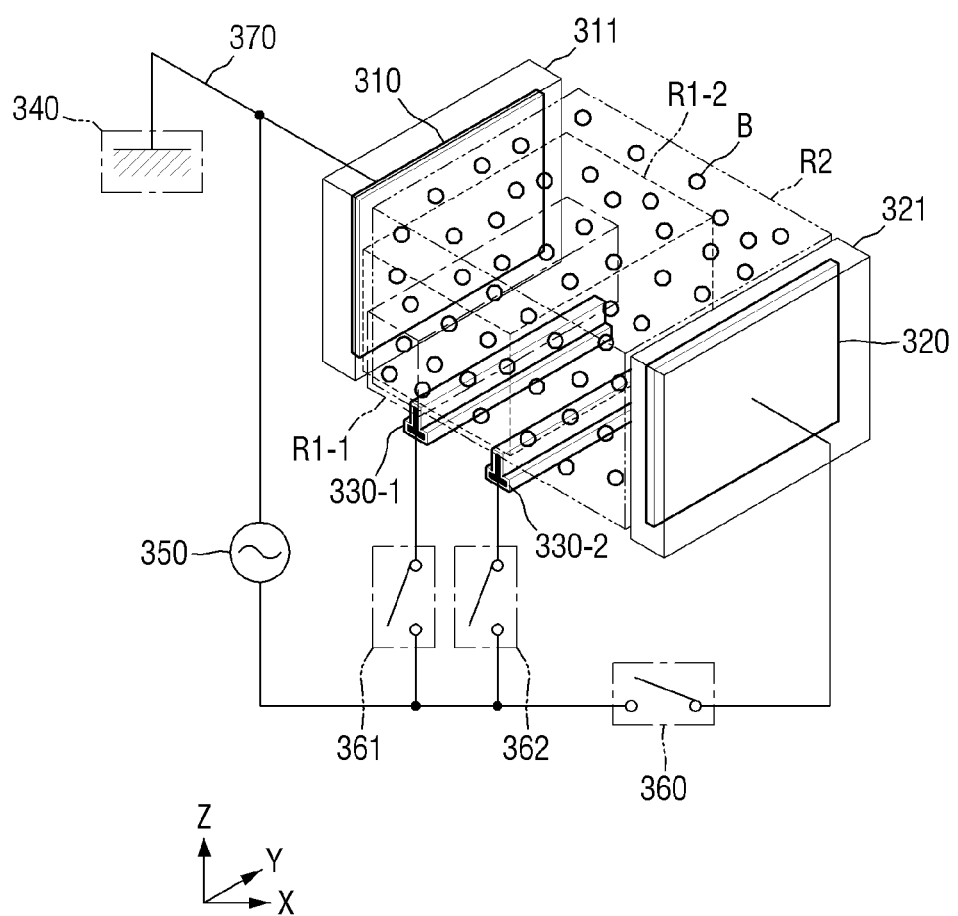
FIG. 9 is a conceptual perspective view illustrating an example of an electrode configuration of a plasma reaction tank of FIG. 8.

FIG. 8 is a schematic view of the cleaning solution production system according to some exemplary embodiments of the present disclosure, and FIG. 9 is a perspective view illustrating an electrode configuration of the plasma reaction tank of FIG. 8. In these figures, like reference numbers refer to like components as described above in connection with FIGS. 1-7, and accordingly, a detail description of such components is not repeated below to avoid redundancy in the description.

Referring to FIGS. 8 and 9, the plasma reaction tank 300 of the cleaning solution production system according to some exemplary embodiments of the present disclosure includes a first ignition electrode 330-1 and a second ignition electrode 330-2.

The first ignition electrode 330-1 and the second ignition electrode 330-2 may be located between the first electrode 310 and the second electrode 320 relative to the first direction X.

The first ignition electrode 330-1 and the second ignition electrode 330-2 may be disposed below the plasma reaction tank 300 in such a manner as to not overlap an area defined between the first electrode 310 and the second electrode 320. That is, the first and second ignition electrodes 330-1 and 330-2 may be disposed downwardly relative to the third direction Z so as not to be interposed between confronting surfaces of the first and second electrodes 310 and 320.

The plasma reaction tank 300 may include a first switch 361 located on the wiring 370 which selectively connects the power source 350 to the first ignition electrode 330-1. The first switch 361 may connect the power source 350 to the first ignition electrode 330-1 when being closed and may block connection between the power source 350 and the first ignition electrode 330-1 when being opened.

The plasma reaction tank 300 may include a second switch 362 located on the wiring 370 which selectively connects the power source 350 to the second ignition electrode 330-2. The second switch 362 may connect the power source 350 to the second ignition electrode 330-2 when being closed and may block connection between the power source 350 and the second ignition electrode 330-2 when being opened.

As described next, plasma is formed in the plasma reaction tank in stages by powering the first electrode, second electrode, first ignition electrode 330-1 and second ignition electrode 330-2.

In a first plasma formation stage, the plasma reaction tank 300 may first connect the power source 350 to only the first ignition electrode 330-1 by closing the first switch 361. Through this, the first ignition electrode 330-1 may ignite plasma so as to form ignition plasma in a first sub-region R1-1. Here, the second switch 362 and the switch 360 may be opened.

Sequentially, in a second plasma formation stage, the plasma reaction tank 300 may additionally connect the power source 350 to the second ignition electrode 330-2 by closing the second switch 362 in addition to the already closed first switch 361. Through this, the second ignition electrode 330-2 may ignite plasma so as to form ignition plasma in a second sub-region R1-2. Here, the switch 360 may be opened.

The second sub-region R1-2 may be larger than the first sub-region R1-1 and may be smaller than a second region R2 formed between the first electrode 310 and the second electrode 320.

Sequentially, in a third plasma formation stage, the plasma reaction tank 300 may close the switch 360 so as to connect the power source 350 to the second electrode 320. Through this, the first electrode 310 and the second electrode 320 may apply voltages to the mixture M and the bubbles B therebetween. Active plasma may be formed in the second region R2 by using the applied voltages. When the switch 360 is closed, the previously closed first switch 361 and the second switch 362 may remain closed.

The plasma reaction tank 300 of the cleaning solution production system according to the embodiments may subdivide a plasma ignition stage by using a plurality of ignition electrodes. Through this, a hardware device may be prevented from being damaged by minimizing energy necessary for plasma ignition.

Although the two ignition electrodes are described as an example in the embodiment, the embodiment is not limited thereto. That is, three or more ignition electrodes may be present. In this case, ignition plasma may be sequentially formed in each of three or more sub-regions and active plasma may be more stably formed.

Hereinafter, a cleaning solution production system according to some exemplary embodiments of the present disclosure will be described with reference to FIG. 10.

Figure 10:
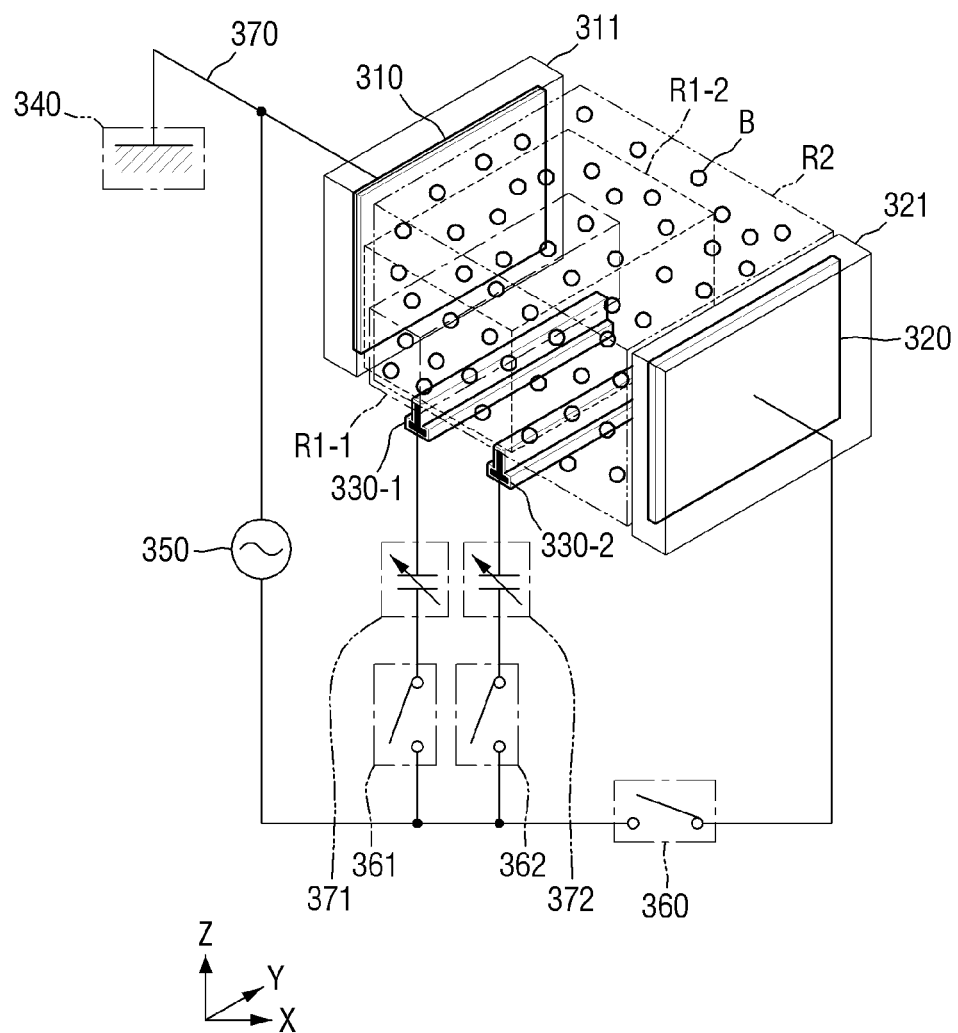
FIG. 10 is a conceptual perspective view illustrating another example of an electrode configuration of a plasma reaction tank of FIG. 8.

FIG. 10 is a conceptual perspective view illustrating another example of an electrode configuration of a plasma reaction tank of FIG. 8. In this figure, like reference numbers refer to like components as described above in connection with FIG. 9, and accordingly, a detail description of such components is not repeated below to avoid redundancy in the description.

Referring to FIG. 10, the plasma reaction tank 300 of the cleaning solution production system according to some exemplary embodiments of the present disclosure may include a first capacitor 371 and a second capacitor 372. The power source 350 may be an AC power source.

The first capacitor 371 may be located on a wiring where the first ignition electrode 330-1 and the power source 350 are connected. When a voltage is applied to the first ignition electrode 330-1 by the first switch 361, the voltage may be gradually applied due to the presence of the first capacitor 371. Accordingly, the possibility of damaging the plasma reaction tank 300 otherwise caused by an abrupt change in voltage applied by the first ignition electrode 330-1 is reduced.

Similarly, when the first switch 361 is opened, the voltage may be gradually removed from the first ignition electrode 330-1 due to the first capacitor 371. Again, this method may prevent the plasma reaction tank 300 including the first ignition electrode 330-1 from being damaged by an abrupt change in voltage.

The second capacitor 372 may be located on a wiring where the second ignition electrode 330-2 and the power source 350 are connected. When a voltage is applied to the second ignition electrode 330-2 by the second switch 362, the voltage may be gradually applied due to the presence of the second capacitor 372. Accordingly, the possibility of damaging the plasma reaction tank 300 as a result of a voltage being abruptly applied by the second ignition electrode 330-2 is reduced.

Similarly, when the second switch 362 is opened, the voltage may be gradually removed from the second ignition electrode 330-2 due to the presence of the second capacitor 372. Again, avoidance of an abrupt voltage change applied to the plasma reaction tank 300 may reduce the likelihood of damage.

In summary, the cleaning solution production system according to the embodiment of FIG. 10 may allow AC power to be gradually applied and removed using the first capacitor 371 and the second capacitor 372. Accordingly, it is possible to minimize damage to the plasma reaction tank 300.

Hereinafter, a cleaning solution production system according to some exemplary embodiments of the present disclosure will be described with reference to FIG. 11. In this figure, like reference numbers refer to like components as described above in connection with the previous figures, and accordingly, a detail description of such components is not repeated below to avoid redundancy in the description.

Figure 11:
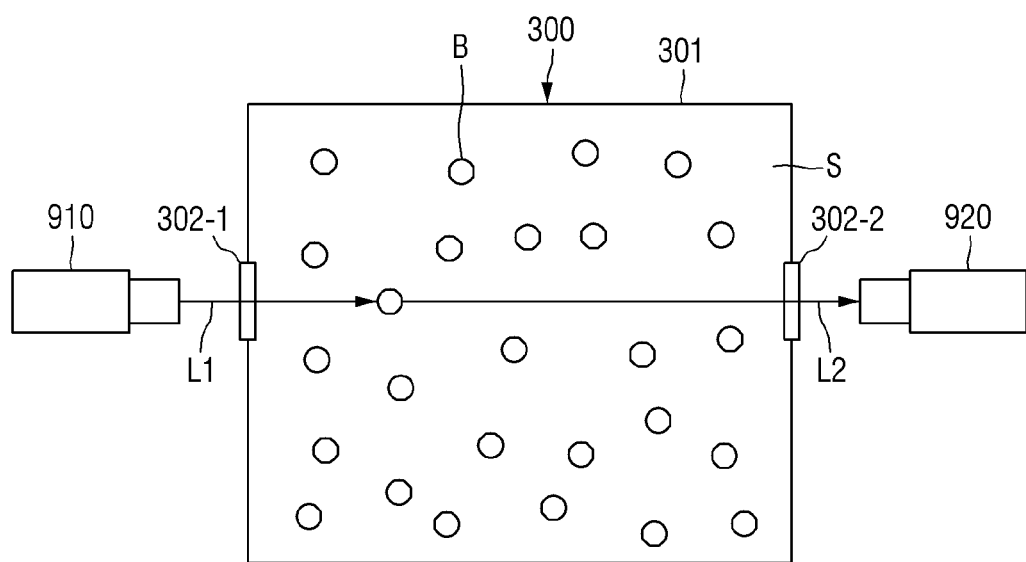
FIG. 11 is a schematic view of another example of a plasma monitoring device.

FIG. 11 is a schematic view for reference in describing another technique for monitoring plasma in the plasma reaction tank 300.

Referring to FIG. 11, the plasma monitoring device 900 of the cleaning solution production system according to some exemplary embodiments of the present disclosure includes an emission module 910 and a reception module 920.

The plasma reaction tank 300 may include a first window 302-1 and a second window 302-2. The first window 302-1 and the second window 302-2 may be formed in the tank body 301. The first window 302-1 and the second window 302-2 may be formed of a transparent material to allow an inside of the plasma reaction tank 300 to be monitored from the outside.

The first window 302-1 and the second window 302-2 may be spaced apart in the second direction Y. That is, the first window 302-1 and the second window 302-2 may be aligned between the first and second electrodes 310 and 320 which are spaced apart in the first direction X (see, e.g., FIGS. 1 and 8). It is noted that the second direction Y is not necessarily perpendicular to the first direction X.

The plasma monitoring device 900 includes the emission module 910 and the reception module 920. The emission module 910 may emit emission light L1. The emission light L1 may be transmitted through the first window 302-1 and may enter the plasma reaction tank 300.

While passing through the cleaning solution S and the bubbles B, the emission light L1 may become reception light L2 in which a particular wavelength is changed. The emission light L1 may be transmitted through the second window 302-2 and may be received by the reception module 920.

The emission module 910 and the reception module 920 may measure a type and a concentration of radicals by using information of the emission light L1 and the reception light L2. Here, the plasma monitoring device 900 may be a measuring apparatus using optical absorption spectroscopy (OAS).

Since the plasma monitoring device 900 may monitor a radical generation reaction of the plasma reaction tank 300, it is possible to check in real time whether generation of the cleaning solution S is performing properly.

Hereinafter, a cleaning water treatment method according to some exemplary embodiments of the present disclosure will be described with reference to FIGS. 1 to 7 and 12. A description which overlaps with the above-described embodiments will be brief or omitted.

Figure 12:
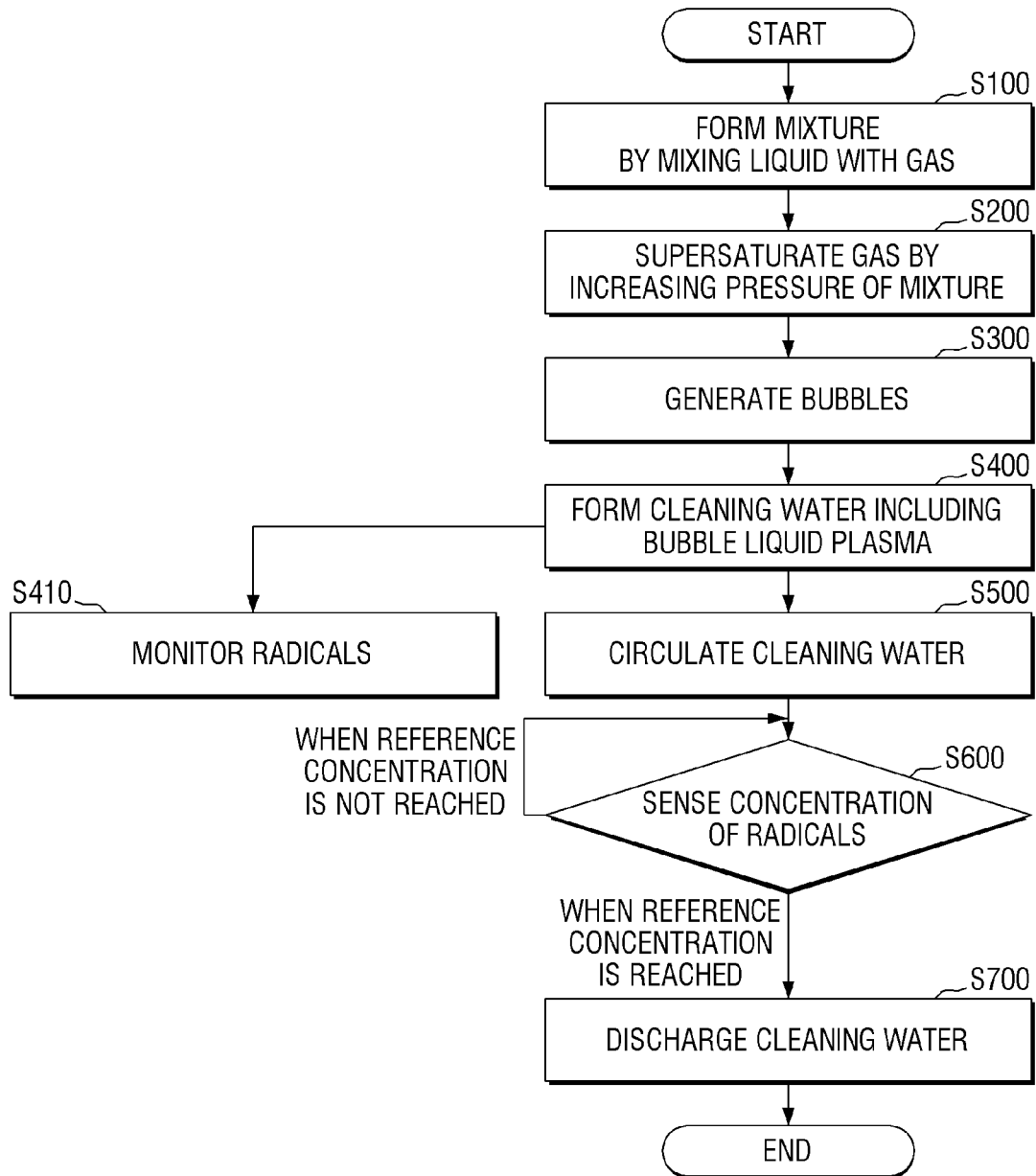
FIG. 12 is a flowchart for reference in describing a cleaning solution treatment method according to some exemplary embodiments of the present disclosure.

FIG. 12 is a flowchart for reference in describing a cleaning water treatment method according to some exemplary embodiments of the present disclosure.

Referring to FIG. 12, a mixture is formed by mixing a liquid and a gas (S100).

In detail, referring to the example of FIGS. 1 and 2, a liquid solvent of the cleaning solution S may be injected through the liquid inlet 130. For example, the solvent may be at least one of distilled water, carbonated water, electrolyte-ionized water, and cleaning water. However, the embodiments herein are not limited to these examples.

The gas inlet 110 may be a path through which a gas is injected into the pressurizing portion 100. A gas for generating radicals in the cleaning solution S may be inserted later through the gas inlet 110. As mentioned previously, the type of gas injected via the gas inlet 110 is dependent upon the type of radicals to be used.

The gas inlet 110 is connected to the liquid forced-transfer portion 120 in which the liquid inlet 130 is formed such that a solvent and a gas may be mixed with each other. For example, the gas inlet 110 is connected to a middle part of the liquid forced-transfer portion 120 such that a gas and a solvent may be mixed with each other according to a flow of the solvent.

The pressure tank 105 of the pressurizing portion 100 may accommodate a mixture M in which a gas and a liquid are mixed. The mixture M may be formed by mixing the gas and the liquid according to injection speeds thereof.

Referring back to FIG. 12, the gas is supersaturated (S200).

In detail, referring to the example of FIGS. 1 and 2, a pressurizing pump (not shown) may be present in the pressurizing portion 100. The pressurizing pump operates to increase pressure in the pressurizing tank 105. When the pressure is increased by the pressurizing pump, a concentration of the gas in the mixture M may increase beyond saturation. In this way, the mixture M may become a compressed liquid of, for example, supersaturated gas-dissolved water in which the gas to be supersaturated is dissolved.

Referring back to FIG. 12, bubbles are generated (S300).

In detail, referring to the example of FIGS. 1 to 3, the orifices 220 may be closed until the mixture M is supersaturated and then may be opened when the mixture is supersaturated. Accordingly, the mixture M moves from the pressurizing portion 100 to the plasma reaction tank 300 through the orifice 220.

Here, since the pressurizing portion 100 has a width much greater than the width of the orifice 220, a pressure applied to the mixture M may be rapidly decreased. Particularly, since the mixture M has a high pressure in the pressurizing portion 100 due to the pressurizing pump, pressures thereof in the bubble forming portion 200 and the plasma reaction tank 300 may be much lower than that in the pressurizing portion 100.

Accordingly, bubbles B may be formed in the mixture M in the plasma reaction tank 300. The bubbles B may be bubbles of a gas injected through the gas inlet 110. That is, the gas may be present in the bubbles B.

Referring back to FIG. 12, cleaning water including bubble liquid plasma is formed (S400).

In detail, referring to the example of FIGS. 1, 4, and 5, the ignition electrode 330 may ignite the bubbles B in the mixture M. The ignition electrode 330 may be connected to the power source 350 by the wiring 370. The ignition electrode 330 may be covered by the third coating 331. The third coating 331 may shield the ignition electrode 330 so as to block and prevent the cleaning solution S or the mixture M from coming into direct contact with the ignition electrode 330.

The plasma reaction tank 300 may initially connect the power source 350 to the ignition electrode 330 prior to the second electrode 320. Through this, the ignition electrode 330 may ignite plasma so as to form ignition plasma in a first region R1.

Sequentially, the plasma reaction tank 300 may close the switch 360 so as to connect the power source 350 to the second electrode 320. Through this, the first electrode 310 and the second electrode 320 may apply voltages to the mixture M and the bubbles B therebetween. Active plasma may be formed in a second region R2 by using the applied voltages.

The plasma reaction tank 300 may apply a voltage to the mixture M using the above-described method. Accordingly, a gas in the bubbles B of the mixture M may be converted into plasma. Such plasma is referred to here as bubble liquid plasma. The plasma reaction tank 300 may convert the mixture M into the cleaning solution S including the bubble liquid plasma.

The cleaning solution S may include radicals which are dissolved in the bubble liquid plasma. The radicals may be dissolved in the cleaning solution S in the bubble liquid plasma while the cleaning solution S circulates through the plasma reaction tank 300, the first pipe 400, the storage tank 500, the radical sensor 600, the second pipe 700, the pressurizing portion 100, and the bubble forming portion 200.

Referring back to FIG. 12, the radicals are monitored (S410).

In detail, referring to the examples of FIGS. 1 and 7, the plasma monitoring device 900 according to some exemplary embodiments of the present disclosure measures a type and a concentration of radicals by using an electrical measuring method. The electrical measuring method monitors the type and concentration of radicals by analyzing electrical properties of liquid plasma including a dielectric. That is, the electrical measuring method may electrically analyze densities and properties of the bubbles B and plasma. For this, the plasma monitoring device 900 may include a power source and an electrode (not shown). Through this, a voltage or a current may be applied to the cleaning solution S and electrical characteristics such as resistance may be detected so as to measure the type and the concentration of the radicals.

In another example, the plasma monitoring device 900 according to some exemplary embodiments of the present disclosure measures a type and a concentration of radicals by using a microwave analysis method. The microwave analysis method may analyze a density of in-liquid plasma by utilizing wave dispersion relation of microwaves.

In another yet example, as described previously in connection with FIG. 7, the plasma monitoring device 900 according to some exemplary embodiments of the present disclosure may measure a type and a concentration of radicals by using an optical analysis method, in which case the plasma monitoring device 900 may be a measuring module using optical emission spectroscopy (OES).

Referring back to FIG. 12, the cleaning water is circulated (S500).

In detail, referring to the example of FIG. 1, the circulation pump 710 may allow the cleaning solution S to circulate in an order of the pressurizing portion 100, the bubble forming portion 200, the plasma reaction tank 300, the first pipe 400, the storage tank 500, the radical sensor 600, and the second pipe 700.

A movement direction and velocity of the cleaning solution S may be defined by the circulation pump 710. Although the circulation pump 710 is shown as being located in the second pipe 700 in FIG. 1, the circulation pump 710 is not limited this particular location.

The circulation pump 710 may be attached at any position in which the cleaning solution S is present, for example, in the first pipe 400 or the storage tank 500.

Referring back to FIG. 12, a concentration of radicals is sensed (S600).

In detail, referring to the example of FIG. 1, the radical sensor 600 may sense the concentration of radicals of the cleaning solution S in the storage tank 500. The radical sensor 600 may sense the concentration of radicals of the cleaning solution S by using a variety of methods.

For example, as described previously, the radical sensor 600 may sense the concentration of radicals of the cleaning solution S by using a spectroscopic method. The spectroscopic method may be a method of measuring a generation speed and a dissipation speed of a radical reaction product, a consumption factor, or a detected compound using NDIR or IR spectroscopy. Through this, the radical sensor 600 may quantitatively analyze radicals of the cleaning solution S.

As another previously described example, the radical sensor 600 of the cleaning solution production system according to some exemplary embodiments of the present disclosure may measure the concentration of radicals by using EPR. EPR may measure a type and a concentration of radicals by using a magnetic moment measuring method using holes of radicals or spins of electrons. Through this, the radical sensor 600 may quantitatively and qualitatively analyze radicals of the cleaning solution S.

Referring back to FIG. 12, here, when the concentration of the radicals does not reach a reference concentration, the cleaning solution S may be continuously circulated until the concentration of the radicals reaches the reference concentration.

When the concentration of the radicals reaches the reference concentration, the cleaning solution S is discharged (S700). For example, the cleaning solution S is discharged to clean a semiconductor substrate or wafer as described previously.

In detail, referring to the example of FIG. 1, when it is determined that a concentration of particular radicals in the cleaning solution S reaches the reference concentration, the radical sensor 600 may open the first valve 810 and may close the second valve 820.

Through this, the cleaning solution S located in the storage tank 500 may move to the nozzle 800. Also, the cleaning solution S which circulates from the storage tank 500 to the radical sensor 600 may not further circulate.

The nozzle 800 may be connected to the storage tank 500. The nozzle 800 may eject the cleaning solution S including radicals onto a wafer W.

Hereinafter, an example of the cleaning water forming operation (400) of FIG. 12 according to some exemplary embodiments of the present disclosure will be described with reference to FIGS. 8, 9, 12, and 13.

Figure 13:
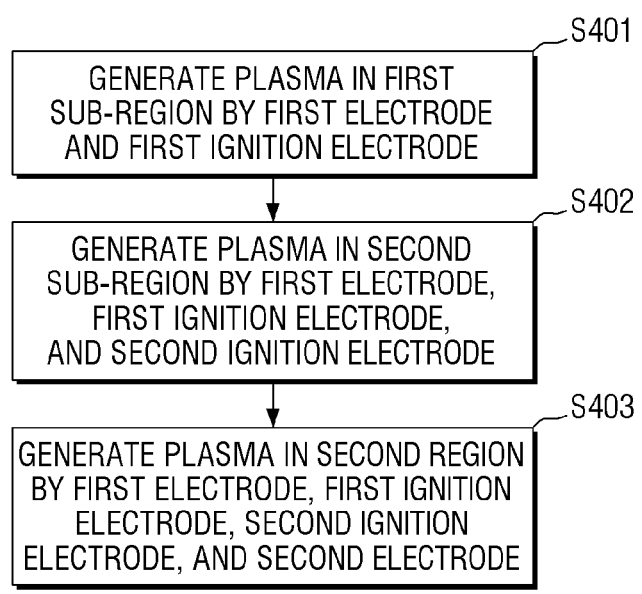
FIG. 13 is a detailed flowchart for reference in describing a cleaning solution forming operation of FIG. 12.

Referring to FIG. 13, plasma is generated in a first sub-region by a first electrode and a first ignition electrode (S401).

In detail, referring to the example of FIGS. 8 and 9, the plasma reaction tank 300 may connect the power source 350 to only the first ignition electrode 330-1 first by closing the first switch 361. Through this, the first ignition electrode 330-1 may ignite plasma so as to form ignition plasma in a first sub-region R1-1. Here, the second switch 362 and the switch 360 may be opened.

Referring back to FIG. 13, plasma is generated in a second sub-region by the first electrode, the first ignition electrode, and the second ignition electrode (S402).

In detail, referring to FIGS. 8 and 9, the plasma reaction tank 300 may connect the power source 350 to the second ignition electrode 330-2 first by closing the second switch 362. Through this, the second ignition electrode 330-2 may ignite plasma so as to form ignition plasma in the second sub-region R1-2. Here, the switch 360 may be opened.

As described previously, the second sub-region R1-2 may be larger than the first sub-region R1-1 and may be smaller than a second region R2 formed between the first electrode 310 and the second electrode 320. When the second switch 362 is closed, the first switch 361 may remain closed.

Referring back to FIG. 13, plasma is generated in the second region by the first electrode, the first ignition electrode, the second ignition electrode, and the second electrode (S403).

In detail, referring to the example of FIGS. 8 and 9, the plasma reaction tank 300 may close the switch 360 so as to connect the power source 350 to the second electrode 320. Through this, the first electrode 310 and the second electrode 320 may apply voltages to the mixture M and the bubbles B therebetween. Active plasma may be formed in the second region R2 by using the applied voltages. When the switch 360 is closed, the first switch 361 and the second switch 362 may remain closed.

What is claimed is:

1. A cleaning solution production system for cleaning a semiconductor substrate, comprising:
    a pressure tank;
    a plasma reaction tank configured to form a plasma in gas bubbles suspended in a decompressed liquid obtained from the pressure tank to thereby generate radical species in the decompressed liquid;
    a storage tank configured to store a cleaning solution containing the radical species generated in the plasma reaction tank; and
    a nozzle configured to supply the cleaning solution from the storage tank to a semiconductor substrate.

2. The system of claim 1, further comprising:
    a sensor for sensing a concentration of the radical species in the cleaning solution; and
    a first valve which is responsive to the concentration sensed by the sensor to selectively apply the cleaning solution to the semiconductor substrate via the nozzle.

3. The system of claim 2, further comprising a second valve which is responsive to the concentration sensed by the sensor to selectively transfer the cleaning solution to the pressure tank for recirculation through the system.

4. The system of claim 3, further comprising a circulation pump operatively connected between the second valve and the pressure tank.

5. The system of claim 1, further comprising a bubble formation device interposed between the pressure tank and the plasma reaction tank.

6. The system of claim 5, wherein the bubble formation device is a plate including a plurality of orifices.

7. The system of claim 1, wherein the plasma reaction tank includes first and second electrodes located at opposite sides of the plasma reaction tank.

8. The system of claim 7, wherein the first and second electrodes are shielded to prevent any contact with the decompressed liquid within the plasma reaction tank.

9. The system of claim 7, further comprising an ignition electrode located below and radially between the first and second electrodes.

10. The system of claim 9, wherein, in a first plasma formation stage, a power source is initially applied to the ignition electrode to form plasma in a first region of the plasma reaction tank, and
    in a second plasma formation stage subsequent the first plasma formation stage, the power source is applied to the second electrode to form plasma in a second region of the plasma reaction tank.

11. The system of claim 9, wherein the ignition electrode is shielded to prevent any contact with the decompressed liquid within the plasma reaction tank.

12. The system of claim 9, wherein the ignition electrode is an elongate electrode having a T-shaped cross-section.

13. The system of claim 7, further comprising first and second ignition electrodes located below and radially between the first and second electrodes.

14. The system of claim 13, wherein, in a first plasma formation stage, a power source is applied to the first ignition electrode to form plasma in a first sub-region of the plasma reaction tank,
    in a second plasma formation stage subsequent the first plasma formation stage, the power source is applied to the second ignition electrode to form plasma in a second sub-region of the plasma reaction tank, and
    in a third plasma formation stage subsequent to the second plasma formation stage, the power source is applied to the second electrode to form plasma in a second region of the plasma reaction tank.

15. The system of claim 1, further comprising a gas inlet configured to supply a gas into the pressure tank, and a liquid inlet configured to supply a liquid into the pressure tank.

16. The system of claim 15, wherein the gas includes at least one of $O_2$, $H_2$, $N_2$, $NF_3$, $C_xF_y$, $F_2$, $Cl_2$, $Br_2$, He, and Ar, where x and y are positive integers.

17. The system of claim 15, wherein the liquid includes water.

18. The system of claim 17, wherein the gas includes $O_2$, and the radical species includes at least one of OH, O, $O_2$, $O_3$, $HO_2$, $H_3O$, and H.

19. The system of claim 17, wherein the radical species includes at least one of NO, $NO_2$, $NO_3$, $CO_2$, $CO_3$, Cl, F, Br, BrO, Cl, ClO, and $HF_2$.

20. The system of claim 1, further comprising a plasma monitoring device configured to monitor a generation of radical species in the decompressed liquid of the plasma reaction tank.

* * * * *